(12) United States Patent
Jun

(10) Patent No.: US 9,515,118 B2
(45) Date of Patent: Dec. 6, 2016

(54) RADIATION DETECTING PANEL

(75) Inventor: Seung Ik Jun, San Jose, CA (US)

(73) Assignee: Rayence Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/375,574

(22) PCT Filed: Jul. 30, 2012

(86) PCT No.: PCT/US2012/048907
§ 371 (c)(1),
(2), (4) Date: Jul. 30, 2014

(87) PCT Pub. No.: WO2013/115841
PCT Pub. Date: Aug. 8, 2013

(65) Prior Publication Data
US 2015/0171135 A1  Jun. 18, 2015

Related U.S. Application Data

(63) Continuation of application No. PCT/US2012/023171, filed on Jan. 30, 2012.

(51) Int. Cl.
*H01L 27/146* (2006.01)

(52) U.S. Cl.
CPC ... *H01L 27/14663* (2013.01); *H01L 27/14603* (2013.01); *H01L 27/14623* (2013.01); *H01L 27/14632* (2013.01); *H01L 27/14692* (2013.01)

(58) Field of Classification Search
CPC .................. H01L 27/14603; H01L 27/14623; H01L 27/14632; H01L 27/14663; H01L 27/14692
See application file for complete search history.

(56) References Cited

U.S. PATENT DOCUMENTS

| 7,521,684 | B2 | 4/2009 | Nomura et al. |
| 7,858,947 | B2 | 12/2010 | Mochizuki et al. |
| 7,956,433 | B2 | 6/2011 | Okada et al. |
| 2008/0210946 | A1 | 9/2008 | Okada et al. |
| 2009/0045727 | A1 | 2/2009 | Kwak et al. |

(Continued)

FOREIGN PATENT DOCUMENTS

| CN | 102157533 A | 8/2011 |
| EP | 2086006 A2 | 8/2009 |

(Continued)

OTHER PUBLICATIONS

International Search Report for International Application No. PCT/US2012/023171, Jun. 7, 2012.

(Continued)

*Primary Examiner* — Mark R Gaworecki
(74) *Attorney, Agent, or Firm* — IP Legal Services, LLC

(57) ABSTRACT

A radiation detecting panel is provided. This panel includes a substrate including a pixel region and a pad region, a scintillating layer configured to convert radiation into visible rays, a photoelectric device configured to convert the visible rays into currents in each pixel, a switching device configured to control output of the currents in each pixel; a plurality of bias lines configured to apply a bias voltage to the scintillating layer and the photoelectric device, a data line configured to be coupled to the switching device to transfer the currents, and a common bias line configured to transfer the bias voltage to the bias lines, wherein the common bias line and the bias lines are located on different layers. The data line and the bias lines are located on the same layer.

15 Claims, 17 Drawing Sheets

(56) References Cited

U.S. PATENT DOCUMENTS

| | | |
|---|---|---|
| 2009/0152563 A1 | 6/2009 | Hayashi et al. |
| 2009/0189231 A1 | 7/2009 | Okada |
| 2009/0290680 A1 | 11/2009 | Tumer et al. |
| 2010/0059804 A1 | 3/2010 | Hayashi et al. |
| 2012/0187464 A1 | 7/2012 | Okada |

FOREIGN PATENT DOCUMENTS

| | | |
|---|---|---|
| JP | 2004-165561 A | 6/2004 |
| WO | 2010/034619 A1 | 4/2010 |

OTHER PUBLICATIONS

Written Opinion of the International Searching Authority for International Application No. PCT/US2012/023171, Jun. 7, 2012.
International Search Report for International Application No. PCT/US2012/048907, Oct. 10, 2012.
Written Opinion of the International Searching Authority for International Application No. PCT/US2012/048907, Oct. 10, 2012.

RADIATION DETECTING PANEL

CROSS REFERENCE TO RELATED APPLICATIONS

This application is a National Stage Patent Application of PCT International Patent Application No. PCT/US2012/048907 (filed on Jul. 30, 2012) under 35 U.S.C. §371, which is a Continuation of PCT International Patent Application No. PCT/US2012/023171 (filed on Jan. 30, 2012), the teachings of which are incorporated herein in their entireties by reference.

TECHNICAL FIELD

This invention relates to a radiation detecting panel.

BACKGROUND ART

A radiation detecting device, such as a flat panel X-ray detector (FDXD), is widely used in a medical industry, a veterinary industry or non-destructive testing industry. The radiation detecting device is generally composed of a radiation detecting panel for converting radiation signals like the X-ray into electric signals, a driving unit for driving the panel, a signal detecting unit for detecting signal output from the radiation detecting panel.

In particular, the radiation detecting panel includes an upper substrate and a lower substrate opposite to each other, a scintillating layer inserted between the two substrates, a photoelectric device and a thin film transistor. The scintillating layer converts the X-rays into the visible rays, the photoelectric device converts these visible rays into currents, the thin film transistor plays a role of a switch for controlling the output of the currents. Thus, the radiation detecting panel can output the electric signals after converting the X-ray into the electric signals.

DISCLOSURE

Technical Problem

The conventional radiation detecting panel is manufactured with processes for forming a thin film transistor-liquid crystal display (TFT-LCD). Thus, the process for manufacturing the radiation detecting panel becomes complicated due to unnecessary steps only required to the TFT-LCD and the difficulty is increased needlessly. Thus, lots of problems, such as increase of process time and cost, degradation of a yield due to the defects occurred from the unnecessary steps, are caused.

Technical Solution

In as aspect of this invention, there is provided a radiation detecting panel including a substrate including a pixel region and a pad region; a scintillating layer configured to convert radiation into visible rays; a photoelectric device configured to convert the visible rays into currents in each pixel; a switching device configured to control output of the currents in each pixel; a plurality of bias lines configured to apply a bias voltage to the scintillating layer and the photoelectric device; a data line configured to be coupled to the switching device to transfer the currents; and a common bias line configured to transfer the bias voltage to the bias lines, wherein the common bias line and the bias lines are located on different layers.

In as aspect of this invention, there is provided a radiation detecting panel including a substrate including a pixel region and a pad region; a scintillating layer configured to convert radiation into visible rays; a photoelectric device configured to convert the visible rays into currents in each pixel; a switching device configured to control output of the currents in each pixel; a plurality of bias lines configured to apply a bias voltage to the scintillating layer and the photoelectric device; and a data line configured to be coupled to the switching device to transfer the currents, wherein the data line and the bias lines are located on the same layer.

Advantageous Effects

This invention provides a radiation detecting panel which is capable of simplifying fabrication processes and reducing difficulties of the processes.

BEST MODE

A radiation detecting panel includes: a substrate on which a pixel region, including a plurality of pixels, and a pad region are defined; a scintillating layer configured to convert radiation into visible rays; a photoelectric device, such as PIN diode, configured to convert the visible rays into currents in each pixel; a switching device configured to control output of the currents in each pixel; a plurality of bias lines configured to apply a bias voltage to the scintillating layer and the photoelectric device; a data line configured to be coupled to the switching device to transfer the currents; and a common bias line configured to transfer the bias voltage to the bias lines, wherein the common bias line and the bias lines are located on different layers. Also, a radiation detecting panel may include: a substrate including a pixel region and a pad region; a scintillating layer configured to convert radiation into visible rays; a photoelectric device configured to convert the visible rays into currents in each pixel; a switching device configured to control output of the currents in each pixel; a plurality of bias lines configured to apply a bias voltage to the scintillating layer and the photoelectric device; and a data line configured to be coupled to the switching device to transfer the currents, wherein the data line and the bias lines are located on the same layer. The transistor includes a gate electrode, a source electrode, a drain electrode and a channel between the source electrode and the drain electrode. The source electrode, the drain electrode and the common bias line are located on the same layer. The photoelectric device may be as PIN diode, and switching device may be a transistor. The data line and the bias lines may be located on the same layer. The data line may include a first data line connected to the source electrode in one body, and a second data line overlapped with the first data line, and the second data line and the bias lines are located on the same layer. The radiation detecting panel may further include an active layer configured to provide a region for the channel and cover a whole structure under the active layer and a light shielding pattern covering the channel. The light shielding pattern and the bias lines are located on the same layer. The radiation detecting panel may further include a gate pad coupled to the gate electrode to control the switching device, a data line pad coupled to the data line; and a common base line pad coupled to the common bias line. These pads are may be located on the same layer.

MODE FOR INVENTION

Hereinafter, referring to FIGS. 1 to 19, a radiation detecting panel and a method of manufacturing the same in accordance with a first embodiment of this invention will be explained.

Figure 1:
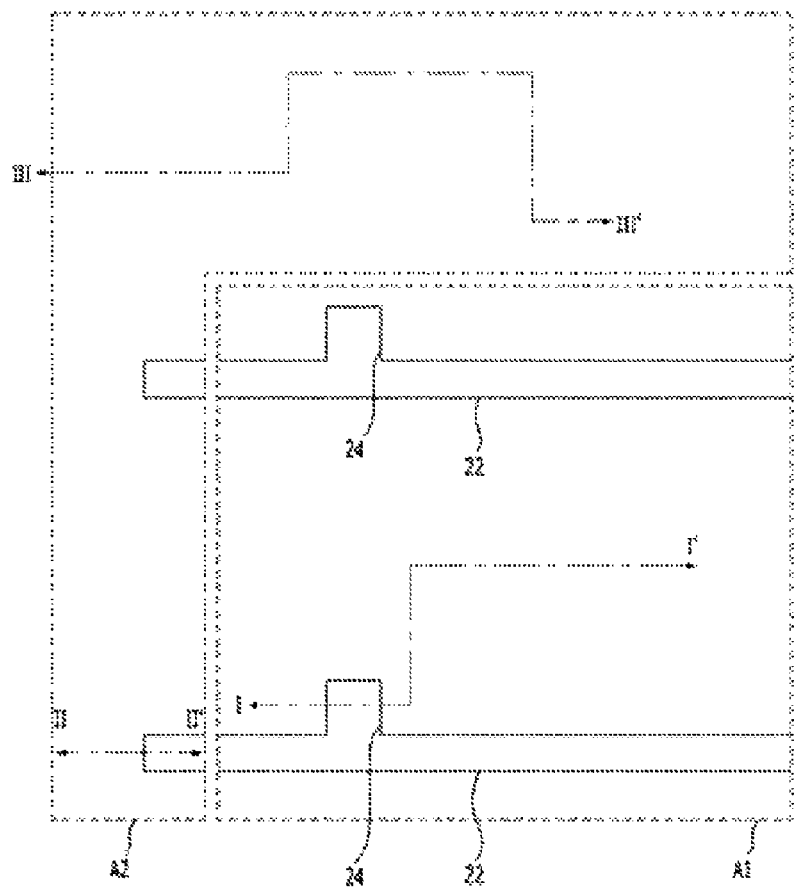
FIGS. 1 to 19 are schematic diagrams of showing processes of manufacturing a radiation detecting panel in accordance with an aspect of this invention.
Figure 2:
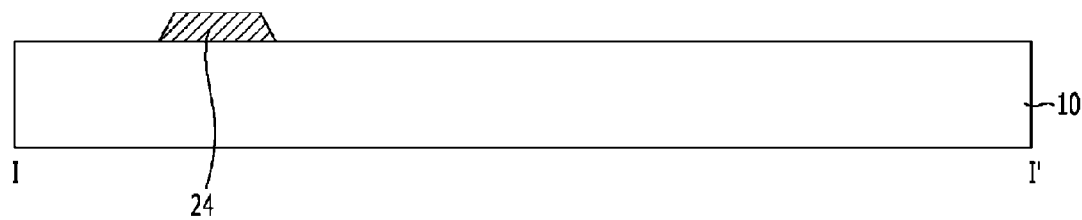
Figure 3:
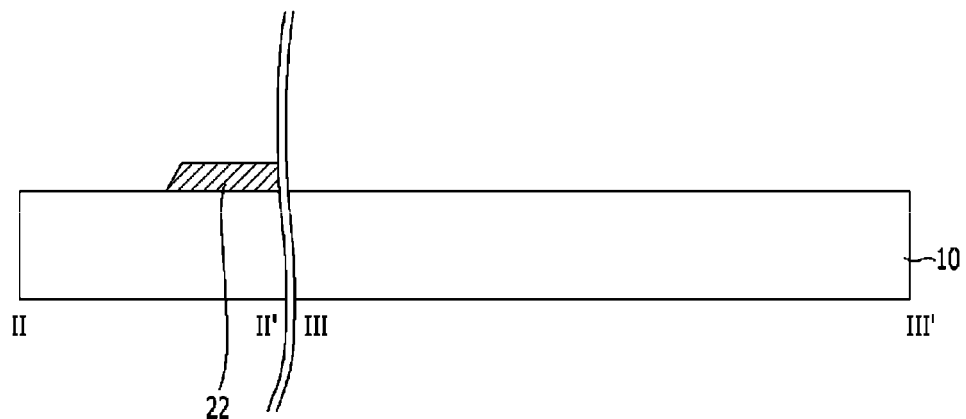

FIG. 1 is a plane view, FIG. 2 is a cross-sectional view of pixel region A1 along a line I-I' of FIG. 1, and FIG. 3 shows a cross-sectional view of pad region A2 along lines II-II' and III-III' of FIG. 1. Referring to FIGS. 1 to 3, lower substrate 10 on which pixel region A1 and pad region A2 are defined may be provided. Lower substrate 10 may be a substrate on which a thin film transistor, i.e., a switching device, and a photoelectric device to be formed. A glass substrate like a borosilicate glass substrate, a quartz substrate or a silicon substrate may be used as lower substrate 10. Gate line 22 may be formed on lower substrate 10. Gate line 22 may be extended from pixel region A1 to pad region A2 in a first direction, for example in widthwise direction, and an end part of gate line 22 may be formed in pad region A2. Gate line 22 may include gate electrode 24 extruding from a main line of gate line 22. Gate electrode 24 may compose a tri-electrode of the thin film transistor with source and drain electrodes. Gate electrode 24 may be formed by forming a conducting layer and patterning the conducting layer with a masking and an etching processes. The conducting layer may be a single layer of No, Al, Nd, Cry, Ti or W or a multiple layer of Mo/Al/Mo, Al/Mo, Mo/AlNd/Mo, Cr/Al/Cr, Cr/AlNd/Cr, Al/Cr, AlNd/Cr, TiW/Al/TiW, Ti/AlNd/Ti, Ti/Al or Ti/AlNd. In this invention, the width of the end part of gate line may be identical to that of gate line 22 because a gate pad will be independently formed hereafter.

Figure 4:
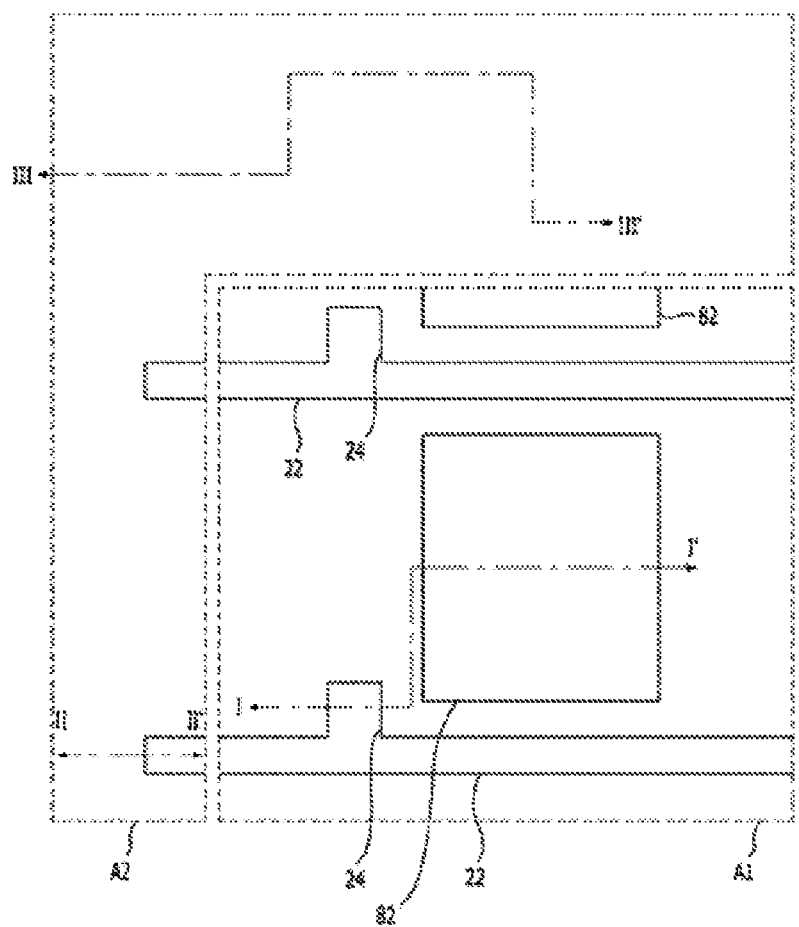
Figure 5:
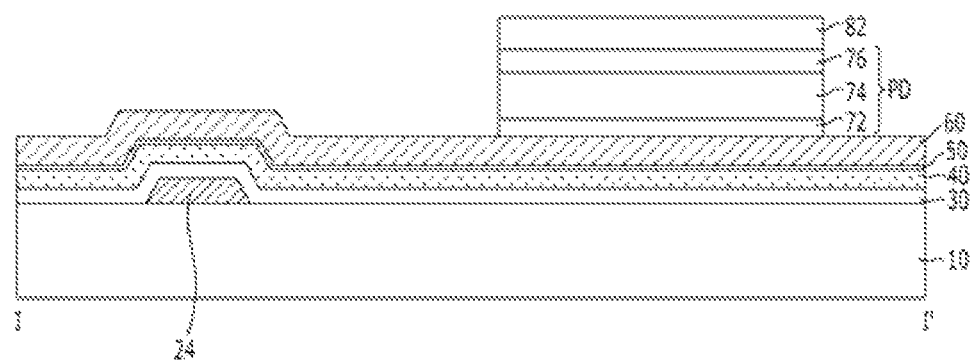
Figure 6:
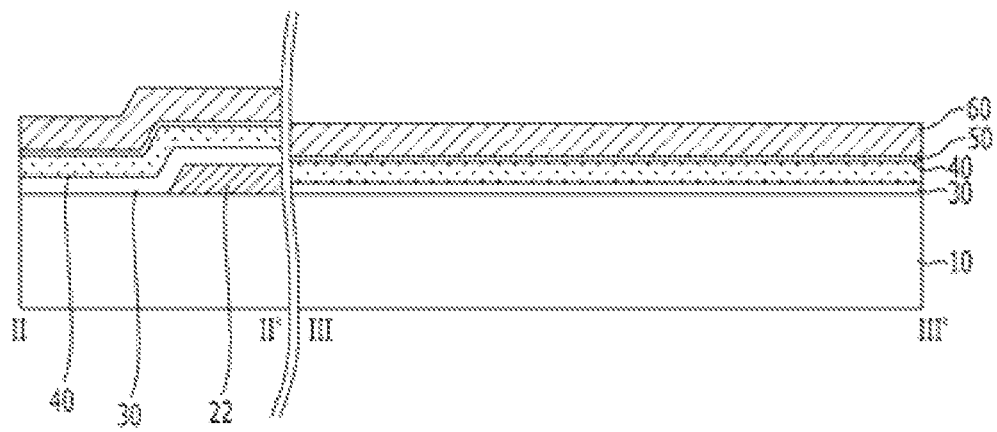

FIG. 4 is a plane view, FIG. 5 is a cross-sectional view of pixel region A1 along a line I-I' of FIG. 4, and FIG. 6 shows a cross-sectional view of pad region A2 along lines II-II' and III-III' of FIG. 4. Referring to FIGS. 4 to 6, gate insulating layer 30, active layer 40, Ohmic contact layer 50 and conducting layer 60 for the source and the drain electrodes are formed one after another on lower substrate 10 on which gate line 22 including gate electrode 24 is already formed. Gate insulating layer 30 may be formed with a single layer or multiple layers of SiOx, SiNx or SiON. Active layer 40 may be for a channel of the thin film transistor and may be formed with amorphous silicon, nano-crystalline silicon, microcrystalline silicon or oxide semiconductor including at least one of Ga, In, Sn and Zn. In case that active layer 40 is formed with the nano-crystalline silicon, characteristics of thin film transistor may be improved owing to the high electron mobility and low leakage current of nano-crystalline silicon. Ohmic contact layer 50 may be formed between active layer 40 and the source and the drain electrodes to be formed later in order to improve the efficiency of the contact between active layer 40 and the source and drain electrodes. Ohmic contact layer 50 may be formed simultaneously with active layer 40 or may be formed independent of active layer 40 with a highly with n-type impurity doped semiconductor, for an instance $n^+$ amorphous silicon or $n^+$ nano-crystalline silicon. Ohmic contact layer 50 may be omitted if the contact between active layer 40 and the source and the drain electrodes are good. Conducting layer 60 for the source and the drain electrodes may be formed with a single layer including Mo, Al and/or Cr or multiple layers of Mo/Al/Mo. PIN diode PD and upper electrode 83 of PIN diode PD may be formed on conducting layer 60. PIN diode PD may be composed with n-type semiconductor layer 72, intrinsic semiconductor layer 74 and p-type semiconductor layer 76. The stacked structure of PIN diode PD and upper electrode 83 may be formed in pixel region A1, defined with gate line 22 and a data line to be formed later leaving the region where the thin film transistor to be formed later. In other words, PIN diode PD and upper electrode 82 may be formed apart from gate line 22 leaving a predetermined space of the regions where a data line and the thin film transistor to be formed. In this embodiment, as shown in the figures, PIN diode PD and upper electrode 82 have a square form. However, the shape of the PIN diode PD and upper electrode 82 is not limited thereto, and the shape of them may be changed variously provide that the conditions above mentioned are satisfied. Further, PIN diode PD and upper electrode 82 may have a different shape or size. For an instance, upper electrode 82 may be larger than PIN diode PD. The stacked structure of PIN diode PD and upper electrode 82 may be formed by depositing n-type semiconductor layer 72, intrinsic semiconductor layer 74 and p-type semiconductor layer 76 for PIN diode PD, and conducting material for upper electrode 82, one after another, and applying a patterning process to them with a masking and an etching processes. The semiconductor layers 72, 74 and 76 for forming PIN diode PD may be amorphous silicon, nano-crystalline silicon, microcrystalline silicon or oxide semiconductor including at least one of Ga, In, Sn and Zn. For an instance, PIN diode PD may be formed with a stacked structure of an $n^+$ nano-crystalline silicon layer, a nano-crystalline silicon layer and a $p^+$ nano-crystalline silicon layer. In this case, characteristics of PIN diode PD may be improved owing to the high electron mobility and the low leakage current of nano-crystalline silicon. The conducting material for forming upper electrode 82 may be Indium Tin Oxide (ITO), Indium Zinc Oxide (IZO), Aluminum Zinc Oxide or ZnO.

The patterning process for forming PIN diode PD and upper electrode 82 may be performed with one mask or a plurality of different masks. In case of adopting one mask, the fabrication process can be simplified. The patterning process for forming PIN diode PD may be performed as follows. A dry etching process may be applied to the layers of the p-type, intrinsic and the n-type semiconductor. The dry etching process may be finished at a relatively reduced etching velocity by decreasing a plasma power by thirty (30) to fifty (50) percent compared to the velocity before the reduction or changing the component ratio of plasma gases, at right before ending the dry etching process. A dry etching processing may be applied to p-type semiconductor layer 76, intrinsic semiconductor layer 74 and n-type semiconductor layer 72, and the dry etching process may be finished when five (5) to twenty (20) percent thickness of n-type semiconductor layer 72 remains. The remnant of n-type semiconductor layer 72 may be etched at the time of pattering the source and the drain electrodes to be formed later. In this case, it is possible to prevent the etching residue of conducting layer for upper electrode 82 from being attached to side walls of PIN diode PD, specifically to the side wall of n-type semiconductor layer 72, and faults like the leakage current may be avoidable. In this embodiment, PIN diode PD is formed as a photoelectric conversion device. However, other photoelectric devices or layers may be formed between conducting layer 60 and upper electrode 82.

Figure 7:
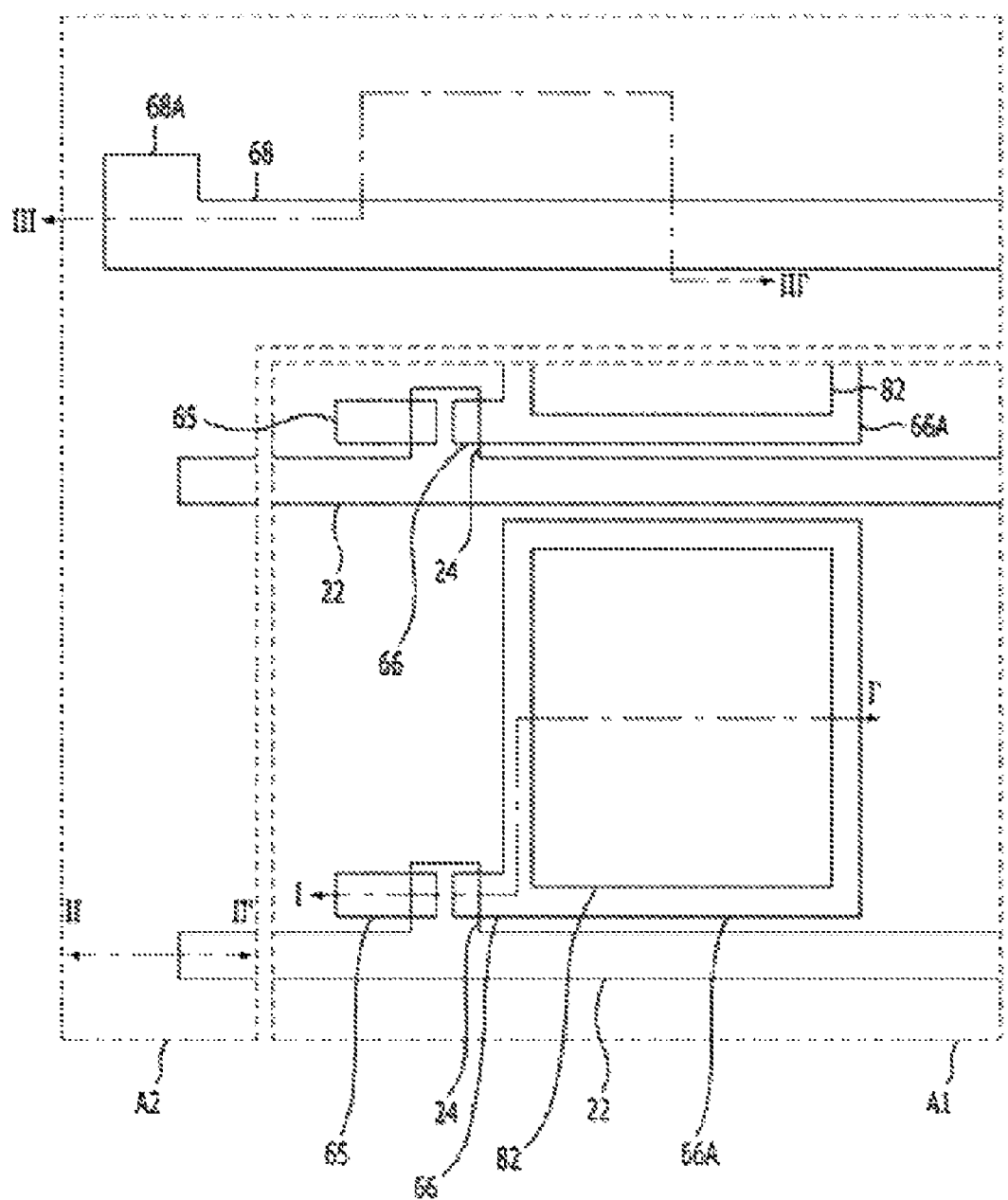
Figure 8:
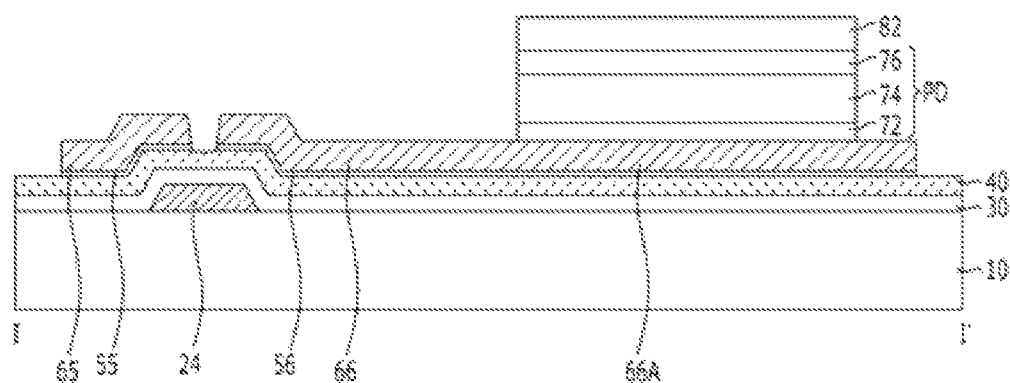
Figure 9:
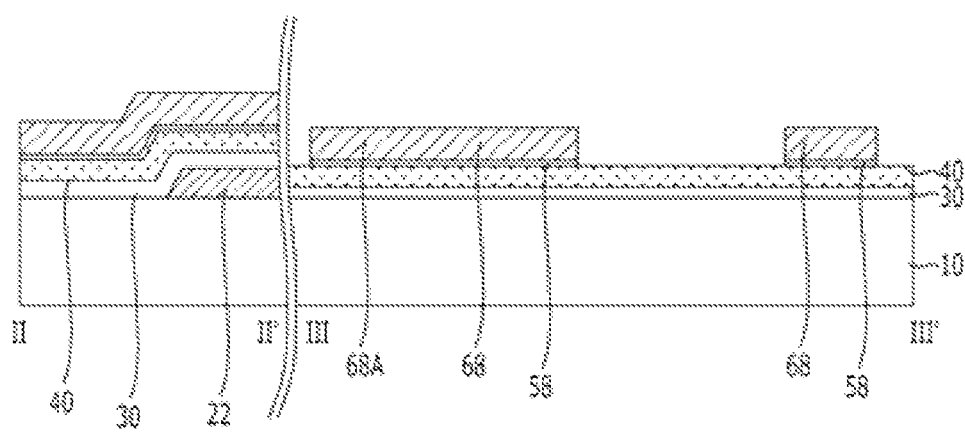

FIG. 7 is a plane view, FIG. 8 is a cross-sectional view of the pixel region A1 along a line I-I' of FIG. 7, and FIG. 9 shows a cross-sectional view of the pad region A2 along lines II-IF and III-III' of FIG. 7. Referring to FIGS. 7 to 9, conducting layer 60 may be patterned by performing a mask process and an etching process to simultaneously form source electrode 65 and drain electrode 66 in pixel region A1 and common bias line 68 in pad region A2. At this time, in case that Ohmic contact layer 50 exits under conducting layer 60, Ohmic contact layer 50 may be patterned with conducting layer 60. The numeral references 55, 56 and 58 denote Ohmic contact formed beneath source electrode 65, drain electrode 66 and common bias line 68, respectively. Source electrode 65 and drain electrode 66, which are respectively overlapped with gate electrode 24, may be apart by a predetermined distance with gate electrode 24 as a center. Drain electrode 66 may include extension part 66A ranging from a part overlapped with gate electrode to an upper region of PIN diode PD. Extension part 66A may be overlapped with PIN diode PD and have a larger area than PIN diode PD. Extension part 66A may be a lower electrode of PIN diode PD. By forming source and drain electrodes 65 and 66, a thin film transistor, having tri-electrodes, i.e., gate electrode 24, source electrode 65 and drain electrode 66, and a channel formed in active layer 30 between source electrode 65 and drain electrode 66, may be formed.

Common bias line 68 may be formed in pad region A2 and be commonly couple to a plurality of bias lines to apply a bias voltage thereto. Common bias line 68 may be in parallel with gate line 22 in pixel region A1 and extended in widthwise direction. Extension part 68A larger than common bias line 68 may be formed at the end of common bias line 68. The resistance of bias line should be small in order to increase an operation speed. In the conventional structure of the radiation detecting unit, the fill factor or step coverage is degraded because the bias line should be across the pixel region when the width and the thickness of the bias line are increased for reducing the resistance. Common bias line 68 of this invention is formed in pad region A2 simultaneously with source and drain electrodes 65 and 66 of pixel region A1, and operation speed of the radiation detecting panel may be increased. In other words, by adopting this invention, the operation speed may be increased and the degradation of the fill factor and the step coverage may be prevented because it is possible to form wide and thick common bias line 68 to be commonly coupled to bias lines, to decrease the resistance of common bias line 68 and to reduce the width and thickness of bias lines passing over pixel region A1. The reduction of the width and thickness of each bias line may not affect the operation speed since most paths of bias voltage are common bias line 68.

In general, a data line, connected to source electrode 65 and extended along a longitudinal direction, is formed with the source electrode 65 in a body. However, in this embodiment, the data line is not formed simultaneously with common base line 68. In other words, the data line and common base line are formed on different layers. Therefore, it is possible to provide a space for common bias line 68, and source electrode 65 may be formed like an island. The order of one patterning process for forming the stacked structure of PIN diode PD and upper electrode 68, shown in FIGS. 4 to 6, and the other patterning process for forming source electrode 65, drain electrode 68 and common bias line 68, shown in FIGS. 7 to 9, may be changed each other. Namely, this latter patterning process for forming source electrode 65, drain electrode 68 and common bias line 68 may be performed prior to the former patterning process forming the stacked structure. In this embodiment, a patterning process for active layer 40, conventionally performed between the patterning processes shown in FIGS. 4 to 6 and FIGS. 7 to 9, is totally omitted. That is to say, active layer 40 may be left on a whole surface of lower substrate 10 without being patterned. Unlike the TFT-LCD panel, the radiation detecting panel does not need a backlight located at a back side of panel to expose light from back to front, thus the pattering process applied to active layer 40 can be omitted in manufacturing the radiation detecting panel. Thus, the fabrication can be simplified by reducing mask and etching processes, at least one time.

Figure 10:
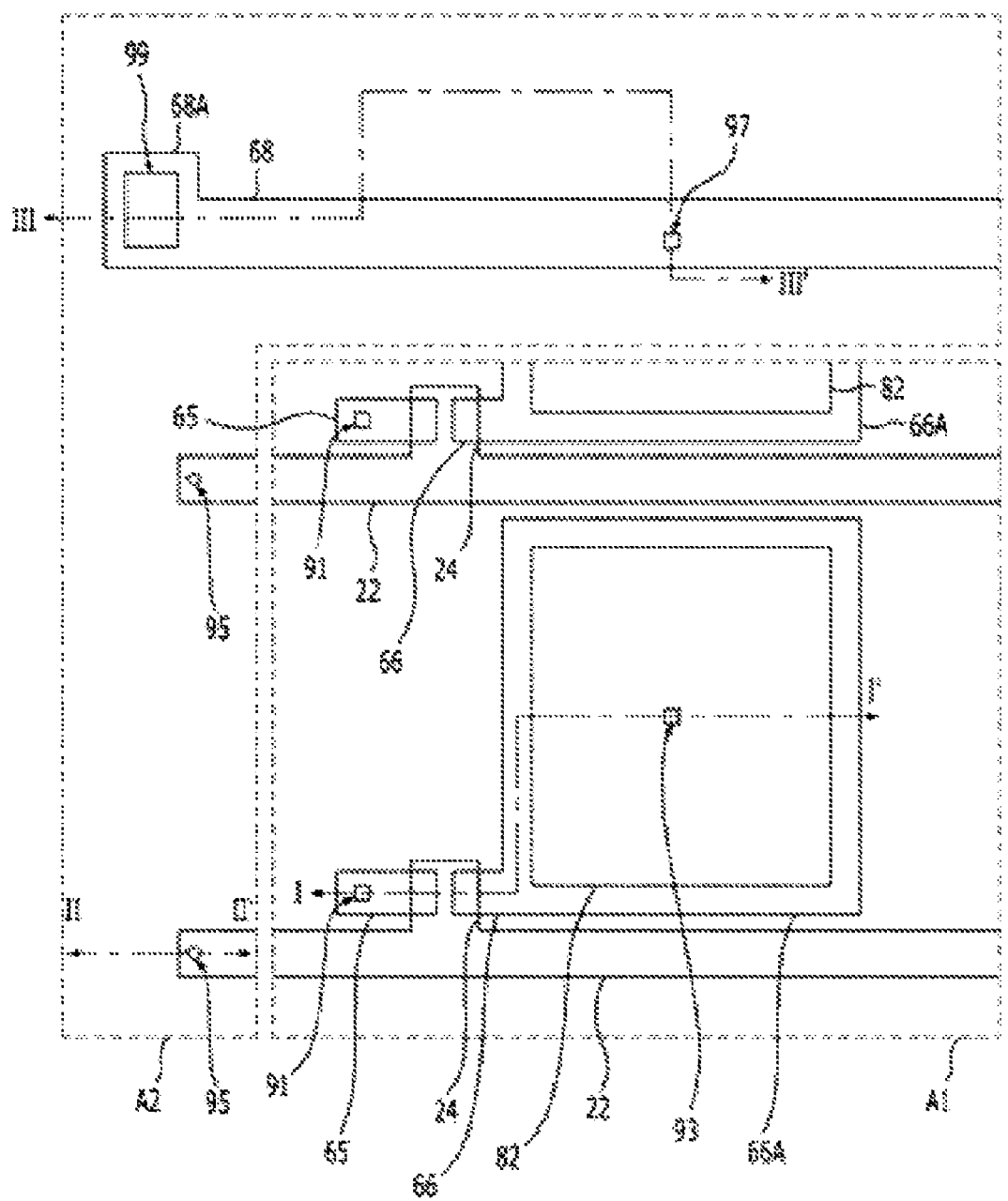
Figure 11:
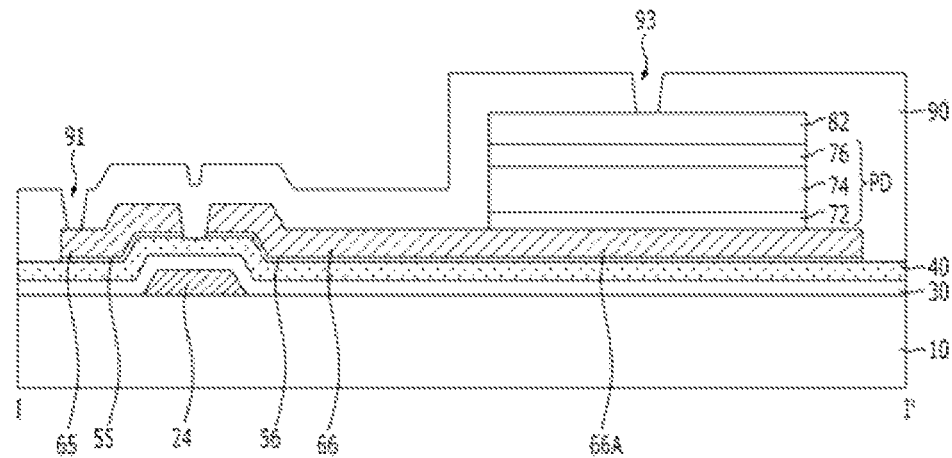
Figure 12:
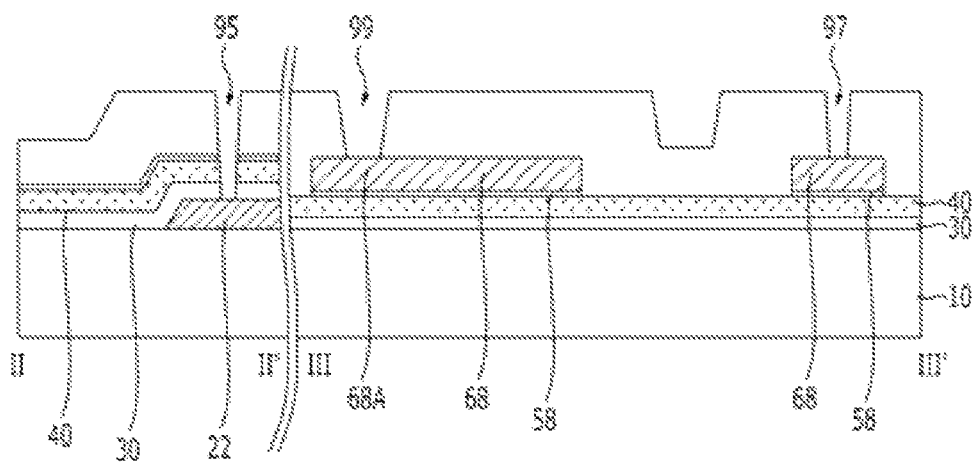

FIG. 10 is a plane view, FIG. 11 is a cross-sectional view of the pixel region A1 along a line I-I' of FIG. 10, and FIG. 12 shows a cross-sectional view of the pad region A2 along lines II-II' and III-III' of FIG. 10.

Referring to FIGS. 10 to 12, inter layer insulating layer 90 is formed to cover a resulting structure obtained after the processes of FIGS. 7 to 9. Interlayer insulation layer 90 may be formed with a single layer or multiple layers of SiOx, SiNx or SiON. A mask process and an etching process may be applied to interlayer insulating layer 90 for forming a first via hole 91 exposing source electrode 65, a second via hole 93 exposing upper electrode 82, a third via hole 95 exposing the end of gate line 22 in pad region A2, a fourth via hole 97 exposing common bias line 68 and a fifth via hole exposing extension part 68A of common bias line 68 in interlayer insulation layer 90. Source electrode 65 will be connected to a data line through first via hole 91, upper electrode 82 will be connected to a bias line through second via hole 93, the end of gate line 22 will be connected to a gate pad through third via hole 95, common bias line 68 will be connected to a bias line through fourth via hole 97, extension part 68A will be connected to a common base line pad through fifth via hole 99. The bias lines will be coupled to pixel region A1 and pad region A2 through second and fourth via holes 93 and 97. As shown in FIG. 10, second and fourth via holes 93 and 97 may be located on the same line in parallel with the longitudinal direction, but the positions of second and fourth via holes 93 and 97 are not limited thereto. First, second, fourth and fifth via holes 91, 93, 97 and 99 may be formed by etching only inter layer insulating layer 90, while third via hole 95 may be formed by etching not only inter layer insulating layer 90 but also active layer 40 and gate insulating layer 30.

Figure 13:
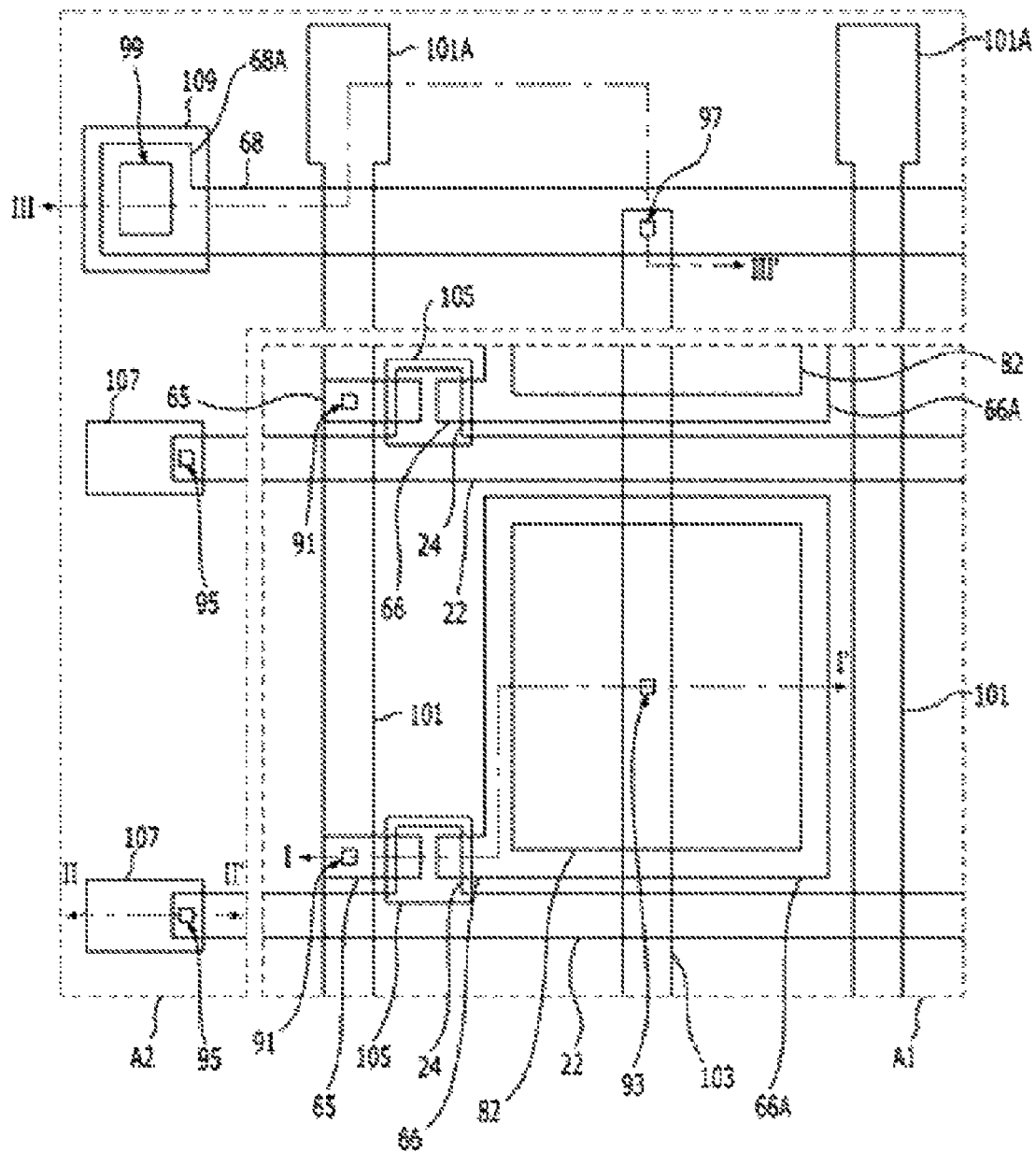
Figure 14:
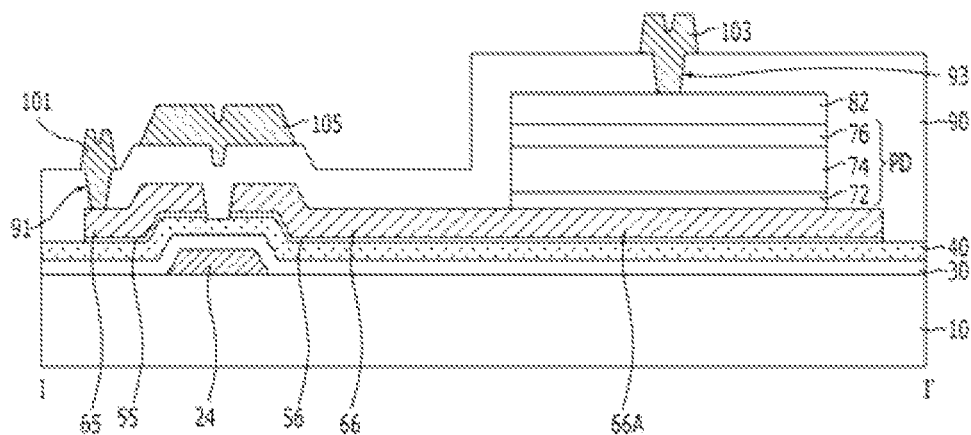
Figure 15:
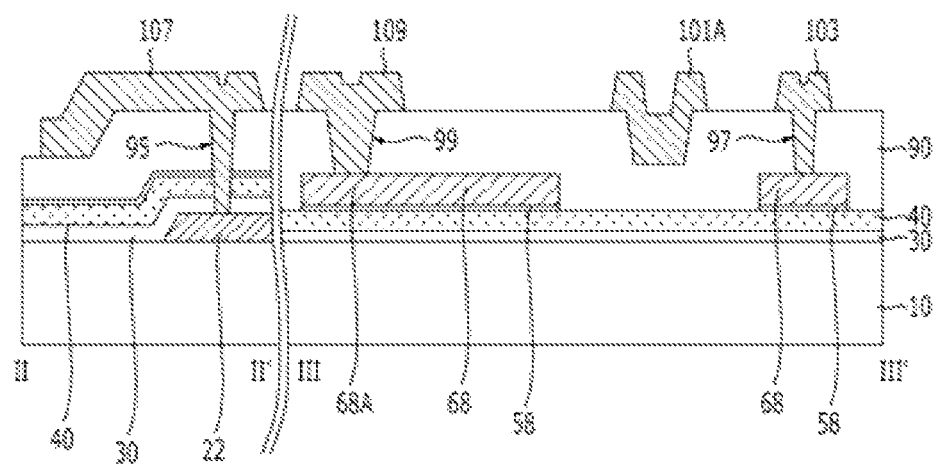

FIG. 13 is a plane view, FIG. 14 is a cross-sectional view of the pixel region A1 along a line I-I' of FIG. 13, and FIG. 15 shows a cross-sectional view of the pad region A2 along lines II-II' and III-III' of FIG. 13. Referring to FIGS. 13 to 15, data line 101 filling and covering first via hole 91, bias line 103 filling and covering second and fourth via holes 93 and 97, gate pad 107 filling and covering third via hole 95, common bias line pad 109 filling and covering fifth via hole 99, and light shielding pattern 105 are formed simultaneous on inter layer insulating layer 90. A single or a multiple conducting layer of Mo, Al, Cr, Ti, W, Ta with a thickness sufficiently filling first to fifth via holes 91, 93, 95, 97 and 99 is deposited on inter layer insulating layer 90 having first to fifth via holes 91, 93, 95, 97 and 99 therein. The multiple conducting layers may be one of Mo/Al/Mo, Cr/Al/Cr, Ti/Al/Ti, TiW/Al/TiW and Ta/Al/Ta. A mask process and an etching process may be applied to pattern the single or the multiple conducting layer and to form data line 101, bias line 103, gate pad 107, common bias line pad 109, and light shielding pattern 105. Data line 101 is connected to source electrode 65 through first via hole 91 to transfer signals output from thin film transistor and extended along a second direction across gate line 22. Data line 101 passes over pixel region A1 and an end of data line 101 may reach pad region A2. At the end of data line 101 in pad region A2, extension part 101A, i.e., a data line pad, wider than data line 101 may be formed. Bias line 103 is connected to upper electrode 82 through second via hole 93 for the purpose of applying a predetermined bias voltage and extended along the longitudinal direction in parallel with data line 101. The bias voltage is a voltage to be used in detecting visible rays from the scintillating layer, converting X-rays into the visible rays and generating a current of a predetermined level. In this invention, the bias line 103 may pass over pixel region A1 and has an end part overlapped with common bias line 68 in pad region A2 and connected to common bias line 68 through fourth via hole 97 so that the bias voltage can be transferred from common bias line 68 to bias line 103. In general, the material of active layer 40 is sensitive to the light. If the light is incident to active layer 40, particularly to the channel, the characteristics of the thin film transistor can be varied. Light shielding pattern 105 may cover at least of the channel, i.e., space between source and drain electrodes 65 and 65 of the thin film transistor, in order to prevent light from being incident to the thin film transistor. In this embodiment, as shown in the figures, light shielding pattern 105 is larger than gate electrode 24 and has a square shape. However, the size and the shape of light shielding pattern 105 can be modified diversely. Gate pad 107 may be connected to one end of gate line 22 through third via hole 95 and may be wider than gate line 22. Common bias line pad 109 may be connected to extension 68A of common base line 68 through fifth via hole 99 and may be wider than common bias line 68 and/or extension 68A thereof. In this invention, data line 101 may be simultaneously formed not with common bias line 68 but with bias line 103 and may be connected to source electrode 65 through first via hole 91. Thus, it is possible to obtain an enough space for common base line 68 and to form data line pad, i.e., extension part 101A, on a layer above common bias line 68. Further, in this embodiment, the data line pad, i.e., extension part 101A of data line 101, gate pad 107 and common bias pad 109, coupled to external lines may be formed on the same layer which is the highest layer under a passivation layer. Therefore, the pads can be easily opened in the following steps.

Figure 16:
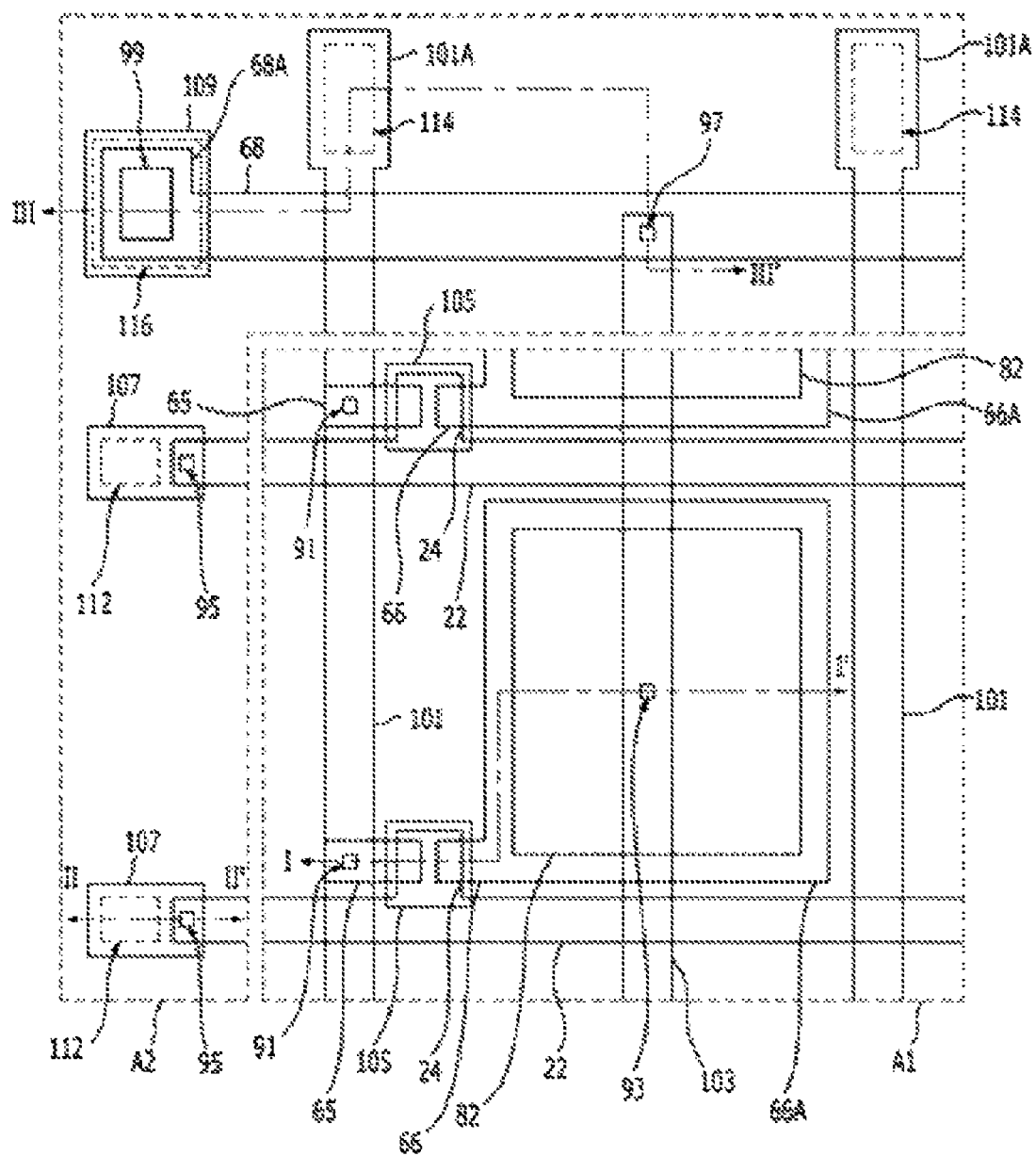
Figure 17:
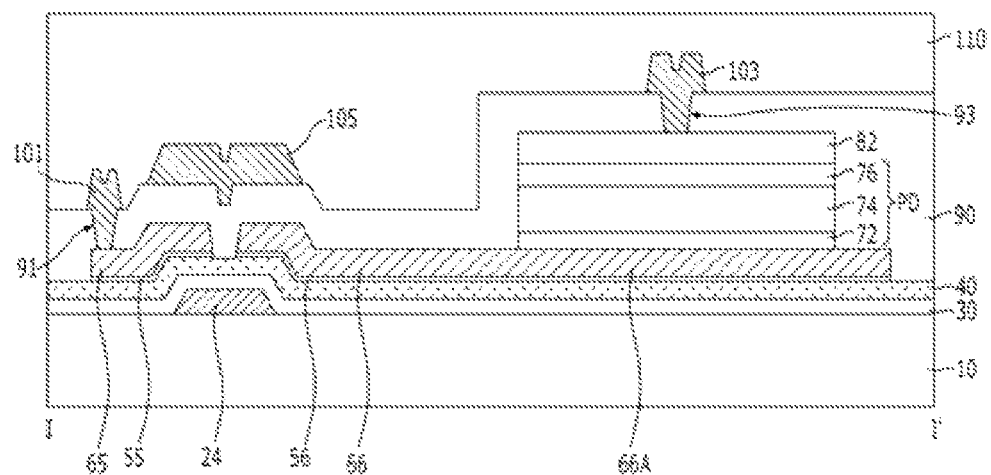
Figure 18:
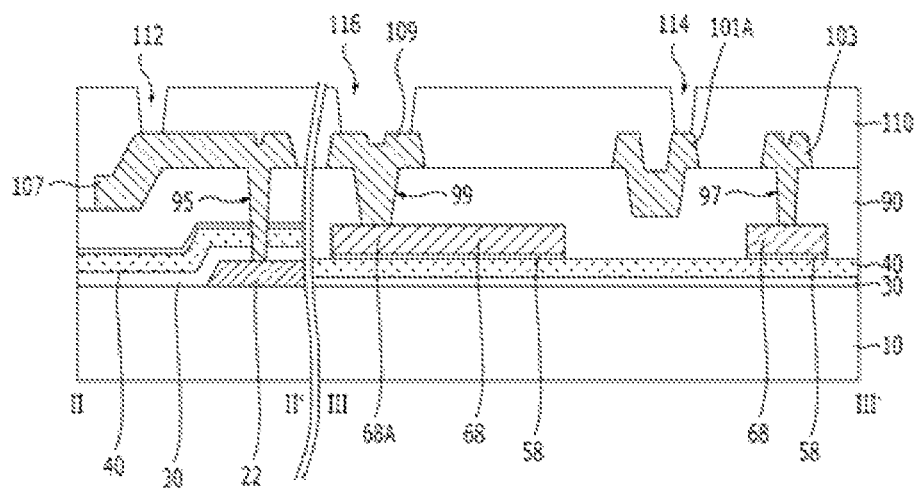

FIG. 16 is a plane view, FIG. 17 is a cross-sectional view of the pixel region A1 along a line I-I' of FIG. 16, and FIG. 18 shows a cross-sectional view of the pad region A2 along lines II-II' and III-III' of FIG. 16. Referring to FIGS. 16 to 18, a passivation layer 110 is formed to cover a resulting structure obtained after the processes of FIGS. 13 to 15. Passivation layer 110 may be formed with a single layer or multiple layers of SiOx, SiNx or SiON. A mask process and an etching process may be applied to passivation layer 110 for forming a first opening 112 exposing gate pad 107, second opening 114 exposing gate pad 107, and third opening 116 exposing gate pad common bias line pad 109. This process for exposing pads is referred to as pad-opening-process. In the conventional radiation detecting panel, the gate pad, data line pad and common bias line pad are located on different layers, and the pad-opening-process is one of the difficult process. The radiation detecting panel in accordance with this embodiment of this invention, the pads are formed on the same layer, and the pads can be easily opened by patterning only passivation layer 110 in the pad-opening-process. Thus, the difficulty of the pad-opening-process can be avoidable, and defects caused by the difficult process can be prevented.

Although it is not shown in the figures, signal lines of the radiation detecting panel of this invention, may be coupled to the external lines through first to third openings, 112, 114 and 116. For examples, gate pad 112 may be coupled to a gate driving unit (not shown) through first opening 112, extension part 101A of data line 101 may be coupled to a signal detecting unit (not shown) through second opening 114, and common bias line pad 109 may be coupled to a bias voltage generating unit (not shown) through third opening 116.

With the processes explained up to now, a lower structure, shown in FIGS. 16 to 18, including the thin film transistor, the photoelectric conversion layer formed can be formed on lower substrate 10.

Figure 19:
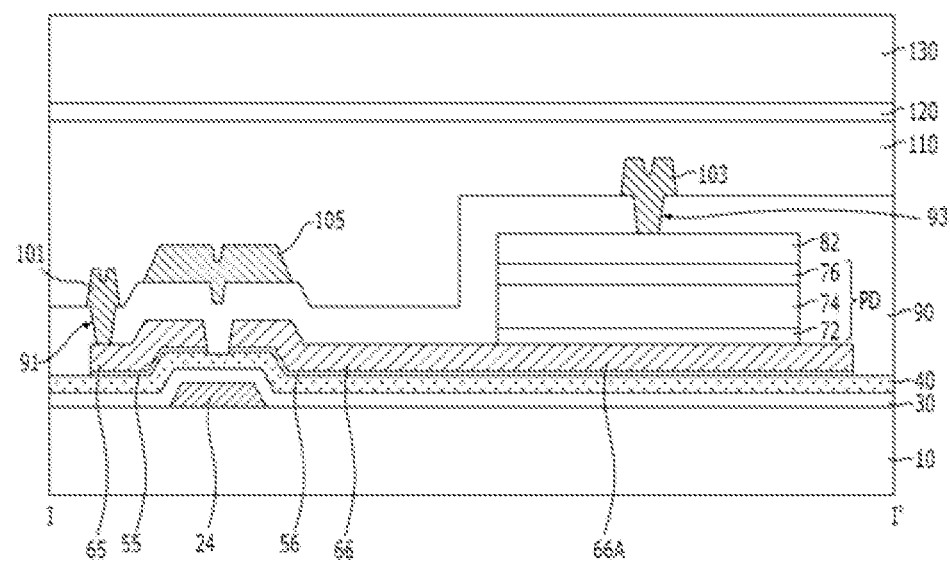

Referring to FIG. 19, lower substrate 10 and upper substrate 130 may be combined by being interposed scintillating layer 120 between the two substrates 10 and 130. The scintillating layer 120 may be formed with material capable of emitting lights owing to collision with the radiation such as X-rays. To put it concretely, scintillating layer 120 may be formed to cover the lower structure on the lower substrate 10, and upper substrate 130 may be attached to lower substrate 10. In an alternatively way, scintillating layer 120 may be formed on upper substrate 130, and the upper substrate 130 and the lower substrate 10 may be combined. In case that scintillating layer 120 is formed over the lower substrate 10, upper substrate 130 can be omitted. FIG. 19 is corresponding to a cross-sectional view of the pixel region A1 along a line I-I' of FIG. 16. Other cross-sectional views along lines II-II' and III-III' are omitted because they are identical to FIGS. 17 and 18.

The radiation detecting panel may be operated as follows. Referring again to FIGS. 16 to 19, scintillating layer 120 may convert radiations such as the X-rays into the visible rays when the radiations are incident to the radiation detecting panel. PIN diode PD, provided that the bias voltage is applied through bias line 103, may detect the visible rays and generate currents. If the bias voltage is not applied to PIN diode PD, PIN diode PD cannot play a role of a sensor. Thus, the currents cannot be generated even thought the visible rays are incident to PIN diode PD. The thin film transistor having the tri-electrodes, i.e., gate electrode 24, source electrode 65 and drain electrode 66, may control the output of the currents generated by PIN diode PD, depending on a voltage applied to gate electrode 24 through gate line 22. The currents generated from PIN diode PD may be input to drain electrode 66, transferred from drain electrode 66 to source electrode 65 under the control of gate electrode 24, and transferred to the outside such as the signal detecting unit through data line 101.

Figure 20:
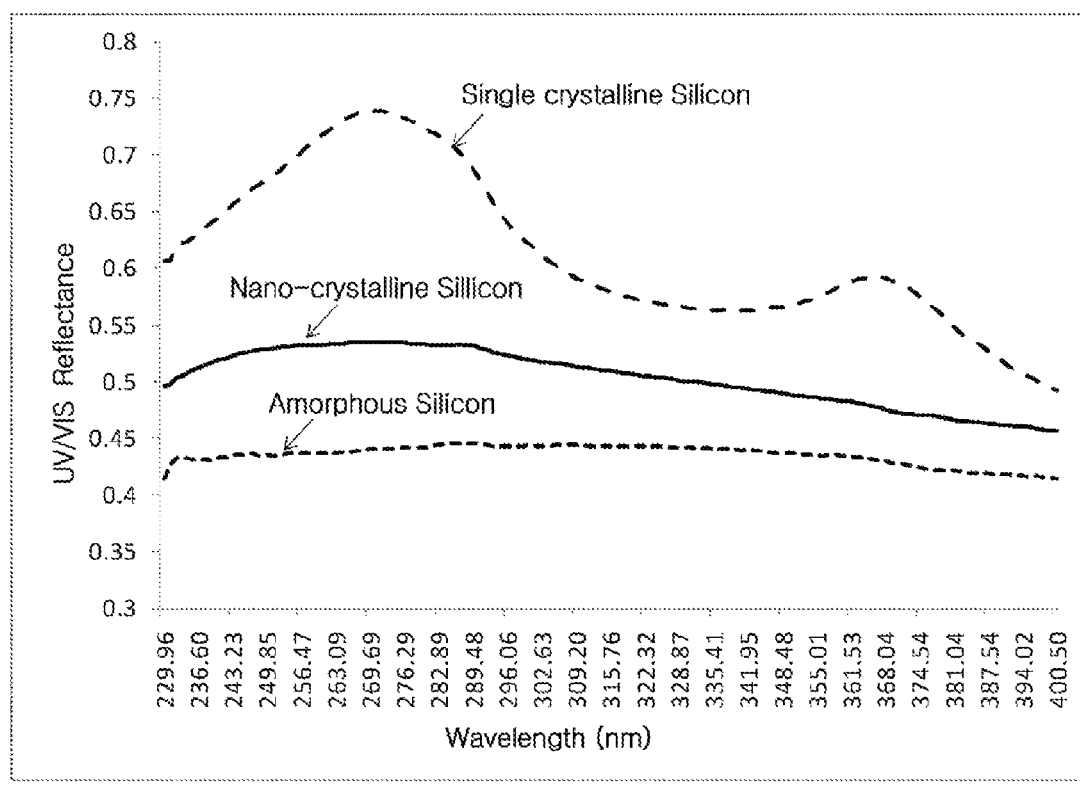
FIGS. 20 and 21 show analysis result of crystallization degrees of a single crystalline silicon layer, a nano-crystalline silicon layer and an amorphous silicon layer.
Figure 21:
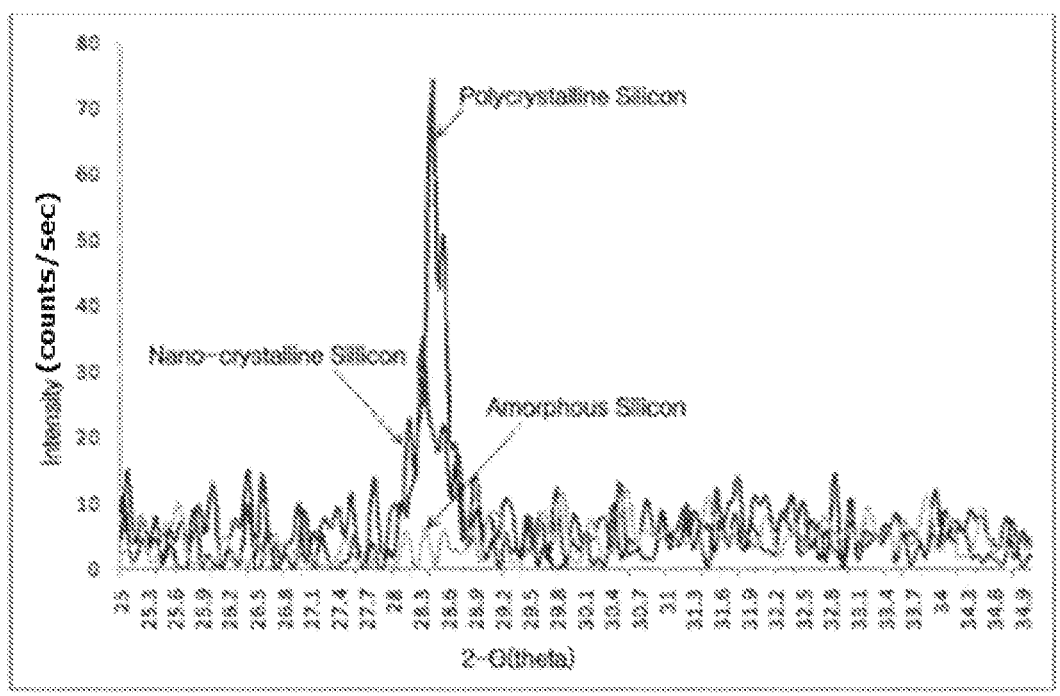

Active layer 40 and/or PIN diode PD of the radiation detecting panel, may be formed with a various silicon layers having different degree of crystallization. The crystallization degree can be controlled by a fabrication method or fabrication condition. FIGS. 20 and 21 show analysis result of crystallization degrees of a single crystalline silicon layer, a nano-crystalline silicon layer and an amorphous silicon layer. FIG. 20 is a diagram showing measurement results of UV/VIS reflectance, and FIG. 21 is diagram showing analysis results of X-ray diffractions (XRDs). The nano-crystalline silicon layer is formed by a plasma enhanced chemical vapor deposition (PECVD). Referring to FIG. 20, the US/VIS refraction of the nano-crystalline silicon layer is between those of the single crystalline silicon layer and the amorphous silicon layer. Referring to FIG. 21, the XRD intensity of the nano-crystalline silicon layer is between those of the single crystalline silicon layer and the amorphous silicon layer. With the results shown by FIGS. 20 and 21, it may be concluded that the nano-crystalline silicon layer can be used for forming the active layer and/or the photoelectric conversion device such as the PIN diode. In case of forming the active layer of the thin film transistor or the photoelectric conversion device with the nano-crystalline silicon, the characteristics of the thin film transistor or the photoelectric conversion device can be improved since, as mentioned above, the nano-crystalline silicon can guarantee the high electron mobility and low leakage current.

Figure 22:
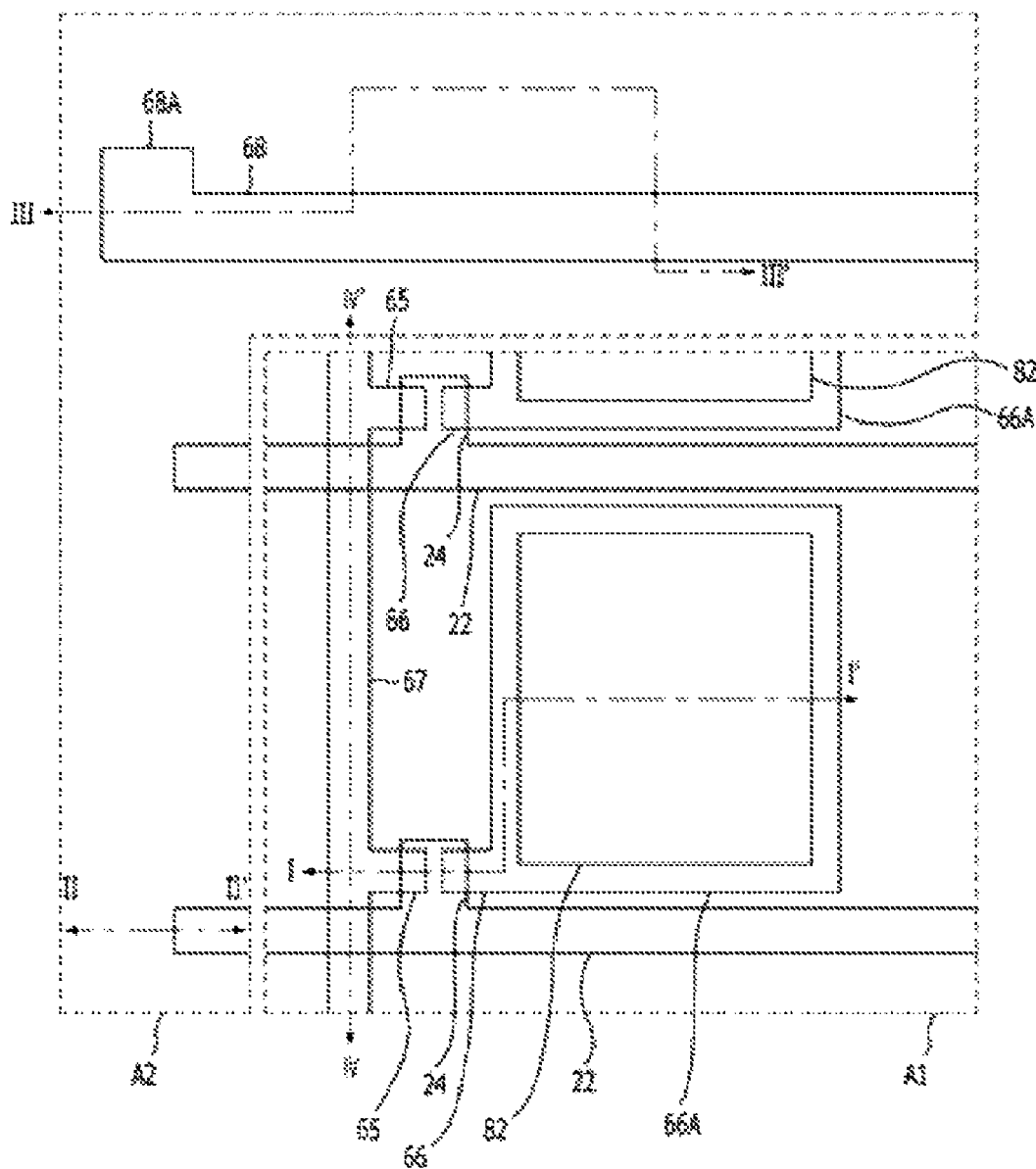
FIGS. 22 to 25 are schematic diagrams of showing processes of manufacturing a radiation detecting panel in accordance with another aspect of this invention.

Hereinafter, a second embodiment of this invention will be explained referring to FIGS. 22 to 25 with the main differences compared with the first embodiment. FIGS. 22 and 24 are plane views, FIGS. 23 and 25 are cross-sectional views of the pixel region along a line IV-IV' of FIGS. 22 and 24, respectively.

As shown in FIGS. 1 to 6, the step of forming gate line 22 including gate electrode 24, successive steps of forming gate insulating layer 30, active layer 40, Ohmic contact layer 50 and conducting layer 60 for source and drain electrodes, and the step of forming the stacked structure of PIN diode PD and upper electrode 82, are performed one after another.

Figure 23:
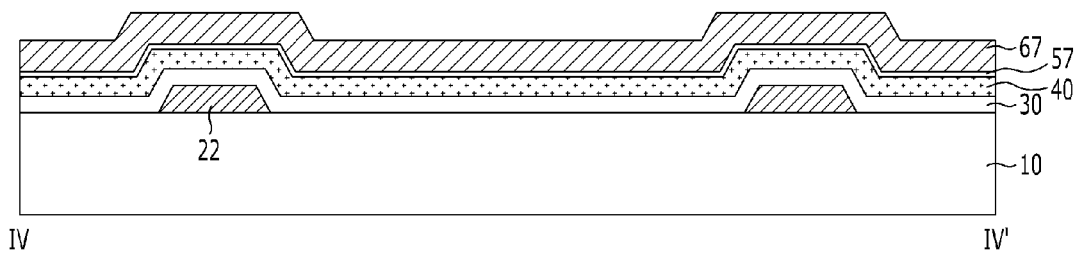
Figure 24:
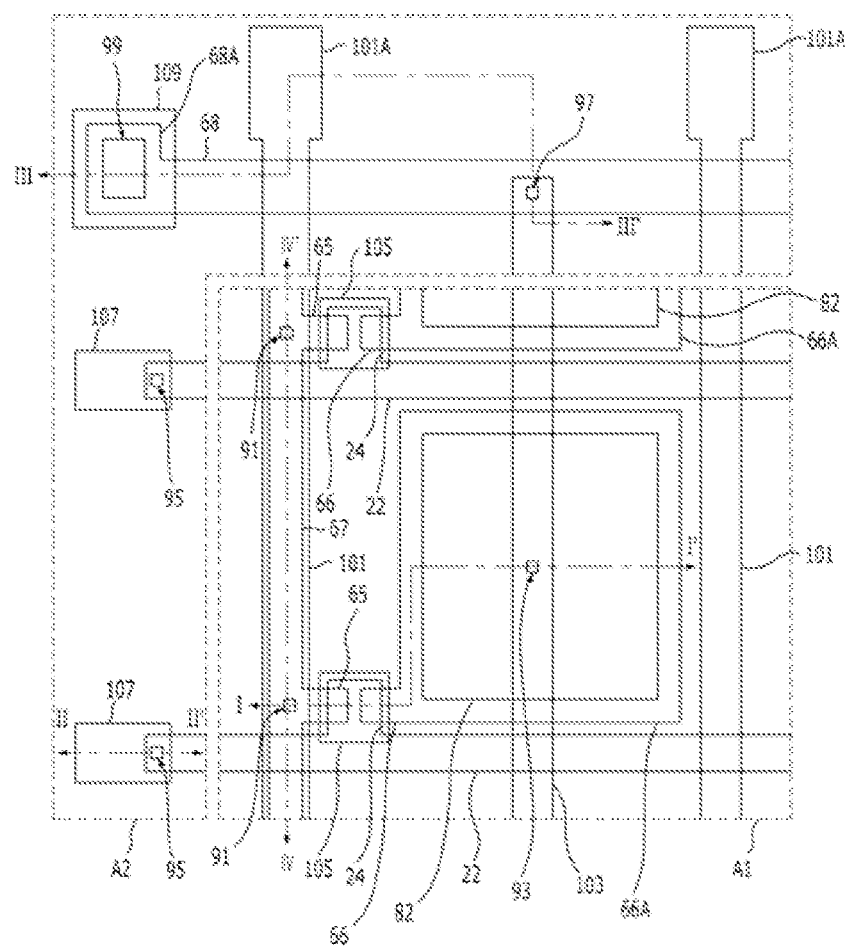

Referring to FIGS. 22 and 23, conducting layer 60 may be patterned by performing a mask process and an etching process to simultaneously form source electrode 65, drain electrode 66, common base line 68, and additional data line 67 connected to source electrode 65. Additional data line 67 may be overlapped with data line 101 in pixel region A1. Additional data line may be extended to pad region A2 or at a least part of additional data line 67 may be extended to pad region A2 to provide a space for common bias line 68. In the patterning process of conducting layer 60, Ohmic contact layer 50 may also be patterned to form Ohmic contact 57 beneath additional data line 67.

Figure 25:
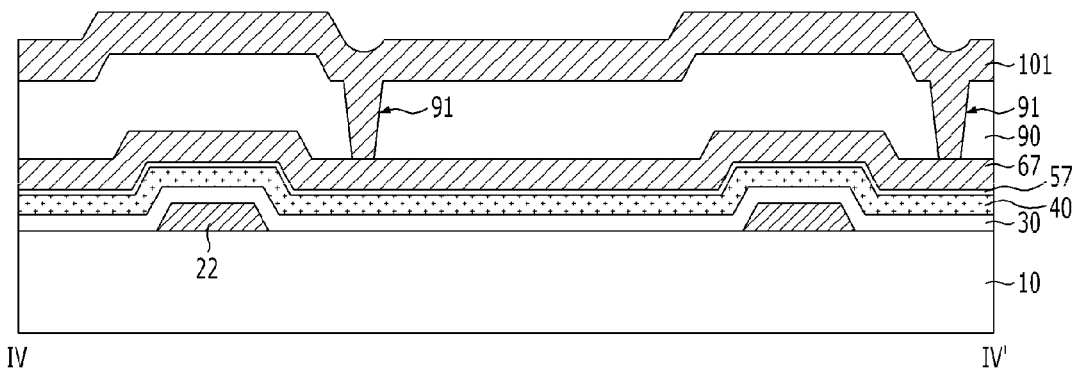

Referring to FIGS. 24 and 25, inter layer insulating layer 90 is formed to cover a resulting structure obtained after the processes of FIGS. 22 and 23. A mask process and an etching process may be applied to interlayer insulating layer 90 for forming a plurality of via holes including a first via hole 91 exposing source electrode 65. At this time, first via hole 91 may open additional data line 67 on behalf of source electrode 65 since the former and the latter are connected to each other. Thereafter, data line 101 coupled to source electrode 65 and additional data line 67 through first via hole 91. Data line 101 may be overlapped with additional data line 67. The processes except the above are substantially identical to those of the first embodiment.

Figure 26:
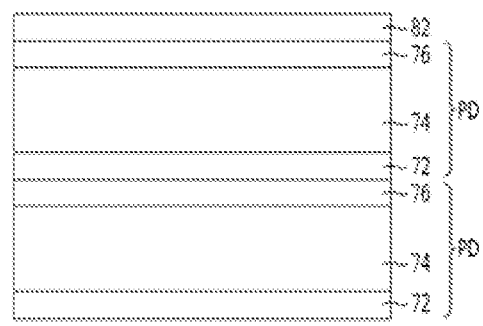
FIGS. 26 and 27 show schematic diagrams of showing another aspect of the invention.

In this embodiment, two layers of data line 101 and additional data line 67 are adopted to the radiation detecting panel. Thus, the radiation detecting panel manufactured in accordance the second embodiment of this invention may provide additional effects as follows. First, the faulty can be prevented and the yield can be improved because data line 101 and additional data line 67 can be a complement each other when one of them are damaged. Second, it is possible to decrease the resistivity and to increase the operation speed of the radiation detecting panel since the total thickness of data line is increased compare to the case of forming a single data line. Last, the characteristics of step coverage may be improved in the process of forming data line 101 on interlayer insulating layer because of additional data line 67 under data line 101. FIG. 26 show the two levels of PIN diodes ODs, however the number of the level of PIN diode is not limited two (2).

Figure 27:
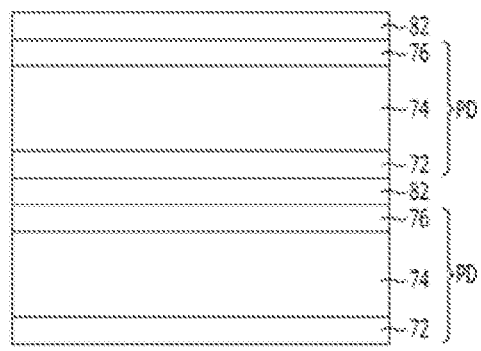

In the first and the second embodiments, PIN diode PD and upper electrode 82 may be formed repeatedly as shown in FIGS. 26 and 27. Referring to FIG. 26, upper electrode 82 may be formed on two levels of PIN diodes PDs. With this structure, the loss of free carriers may be reduced when the visible rays are converted into the electric signals, and the intensity of the electric signals outputting from the radiation can be increased. Therefore, amplification effect can be improved and the sensitivity of the radiation detecting unit can also be improved.

Referring to FIG. 27, upper electrode 82 may be interposed between the stacked PIN diodes. This structure can improve the uniformity of the sensitivity.

The configuration and the operation of the present invention are illustrated in the above referring the drawings. The configuration and the operation are merely examples of the present invention. Thus, various changes and modifications may be suggested within the scope of the present invention.

INDUSTRIAL APPLICABILITY

This invention can be used in detecting radiation in medical, veterinary or non-destructive testing industry.

The invention claimed is:

1. A radiation detecting panel, comprising:
   a substrate including a pixel region and a pad region;
   a scintillating layer configured to convert radiation into visible rays;
   a photoelectric device configured to convert the visible rays into currents in each pixel;
   a switching device configured to control output of the currents in each pixel;
   a plurality of bias lines configured to apply a bias voltage to the scintillating layer and the photoelectric device;
   a data line configured to be coupled to the switching device to transfer the currents; and
   a common bias line configured to transfer the bias voltage to the bias lines, wherein the common bias line formed only in the pad region, the common bias line is formed in a layer lower than and different from a layer of the bias lines, and the bias lines are formed on the pixel region and extends to the pad region.

2. The radiation detecting panel of claim 1, wherein the switching device includes a gate electrode, a source electrode, a drain electrode and a channel between the source electrode and the drain electrode, wherein source electrode, the drain electrode and the common bias line are located on the same layer.

3. The radiation detecting panel of claim 2, wherein the data line includes a first data line connected to the source electrode in one body, and a second data line overlapped with the first data line, and the second data line and the bias lines are located on the same layer.

4. The radiation detecting panel of claim 2, further comprising an active layer configured to provide a region for the channel and cover a whole structure under the active layer.

5. The radiation detecting panel of claim 2, further comprising a light shielding pattern covering the channel, wherein the light shielding pattern and the bias lines are located on the same layer.

6. The radiation detecting panel of claim 1, further comprising a common bias line pad coupled to the common bias line, wherein the common bias line pad and the bias lines are located on the same layer.

7. The radiation detecting panel of claim 1, wherein the data line and the bias lines are located on the same layer.

8. The radiation detecting panel of claim 1, further comprising:
- a first pad configured to be coupled to the switching device to control the switching device;
- a second pad configured to be coupled to the data line; and
- a third pad coupled to the common bias line, wherein the first pad, the second pad, and the third pad are located on the same layer.

9. A radiation detecting panel, comprising:
- a substrate including pixel region and a pad region;
- a scintillating layer configured to convert radiation into visible rays;
- a photoelectric device configured to convert the visible rays into currents in each pixel;
- a switching device configured to control output of the currents in each pixel;
- a plurality of bias lines configured to apply a bias voltage to the scintillating layer and the photoelectric device;
- a common bias line configured to transfer the bias voltage to the bias lines, wherein the common bias line formed only in the pad region, the common bias line is formed in a layer lower than and different from a layer of the bias lines, and the bias lines are formed on the pixel region and extends to the pad region; and
- a data line configured to be coupled to the switching device to transfer the currents, wherein the data line and the bias lines are located on the same layer.

10. The radiation detecting panel of claim 9, wherein the data line includes a first data line connected to the source electrode in one body, and a second data line overlapped with the first data line, and the second data line and the bias lines are located on the same layer.

11. The radiation detecting panel of claim 9, further comprising an active layer configured to provide a region for the channel and cover a whole structure under the active layer.

12. The radiation detecting panel of claim 9, further comprising a light shielding pattern covering the channel, wherein the light shielding pattern and the bias lines are located on the same layer.

13. The radiation detecting panel of claim 9, wherein the switching device includes a gate electrode, a source electrode, a drain electrode and a channel between the source electrode and the drain electrode, wherein source electrode, the drain electrode and the common bias line are located on the same layer.

14. The radiation detecting panel of claim 9, further comprising:
- a common bias line pad coupled to the common bias line, wherein the common bias line pad and the bias lines are located on the same layer.

15. The radiation detecting panel of claim 14, further comprising:
- a first pad configured to be coupled to the switching device to control the switching device;
- a second pad configured to be coupled to the data line; and
- a third pad coupled to the common bias line, wherein the first pad, the second pad, and the third pad are located on the same layer.

* * * * *